(12) United States Patent
Wu

(10) Patent No.: US 9,161,437 B2
(45) Date of Patent: Oct. 13, 2015

(54) CIRCUIT BOARD WITH SIGNAL ROUTING LAYER HAVING UNIFORM IMPEDANCE

(71) Applicant: HON HAI PRECISION INDUSTRY CO., LTD., New Taipei (TW)

(72) Inventor: Kai-Wen Wu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 69 days.

(21) Appl. No.: 13/864,262

(22) Filed: Apr. 17, 2013

(65) Prior Publication Data

US 2014/0182902 A1    Jul. 3, 2014

(30) Foreign Application Priority Data

Dec. 27, 2012   (TW) .............................. 101150700 A

(51) Int. Cl.
*H05K 1/03*   (2006.01)
*H05K 1/02*   (2006.01)

(52) U.S. Cl.
CPC .............. *H05K 1/0253* (2013.01); *H05K 1/025* (2013.01); *H05K 1/0216* (2013.01); *H05K 2201/093* (2013.01); *H05K 2201/09409* (2013.01); *H05K 2201/09727* (2013.01)

(58) Field of Classification Search
CPC .............. H05K 1/0213; H05K 1/0253; H05K 2201/09727; H05K 2201/093; H05K 2201/09409
USPC .......... 174/250–268; 361/760, 767, 777, 816, 361/818, 792–795; 333/124, 236–238
See application file for complete search history.

(56) References Cited

U.S. PATENT DOCUMENTS

| | | | |
|---|---|---|---|
| 6,525,921 B1* | 2/2003 | Nakatani et al. | 361/306.3 |
| 6,710,258 B2* | 3/2004 | Oggioni et al. | 174/255 |
| 2002/0113320 A1* | 8/2002 | Akram et al. | 257/778 |
| 2007/0134953 A1* | 6/2007 | Morana et al. | 439/76.1 |
| 2010/0101850 A1* | 4/2010 | Chou | 174/261 |

* cited by examiner

*Primary Examiner* — Ishwarbhai B Patel
(74) *Attorney, Agent, or Firm* — Novak Druce Connolly Bove + Quigg LLP

(57) ABSTRACT

A circuit board comprises a signal routing layer, a first dielectric layer, a second dielectric layer, a third dielectric layer, a first ground layer, a second ground layer, and a third ground layer. The signal routing layer includes chip traces, connector traces, and signal traces connected to components. The first dielectric layer, the first ground layer, the second dielectric layer, the second ground layer, the third dielectric layer, and the third ground layer, in that order, are located at gradually increasing distances from the signal routing layer. The first ground layer corresponds to the chip traces, the second ground layer corresponds to the signal traces, and the third ground layer corresponds to the connector traces.

10 Claims, 3 Drawing Sheets

CIRCUIT BOARD WITH SIGNAL ROUTING LAYER HAVING UNIFORM IMPEDANCE

BACKGROUND

1. Technical Field

The present disclosure relates to circuit boards, and particularly to a circuit board with signal routing layer having uniform impedance.

2. Description of Related Art

Trace impedances of circuit boards must be kept uniform throughout all the traces for good signal transmitting ability. Yet, at some points of the traces, for example, the impedance of a trace which is connected to a connector may be smaller than the impedance of a trace which is connected to a chip.

Therefore, it is desirable to provide a circuit board which can overcome the limitation described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views, and all the views are schematic.

DETAILED DESCRIPTION

Figure 1:
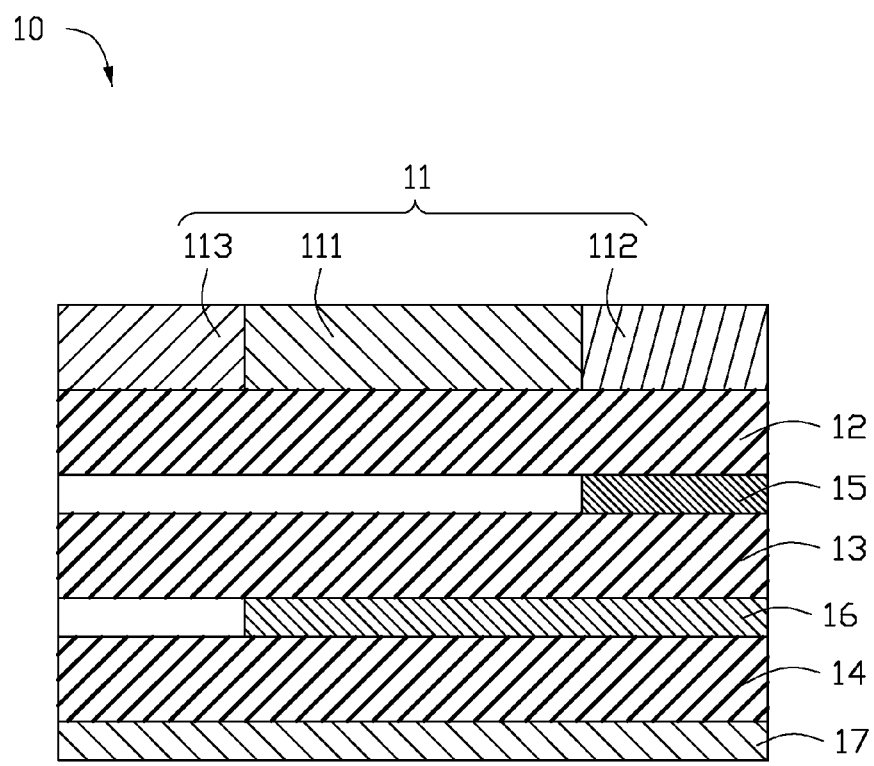
FIG. 1 is a sectional view of a circuit board with signal routing layer having uniform impedance, of one embodiment.
Figure 2:
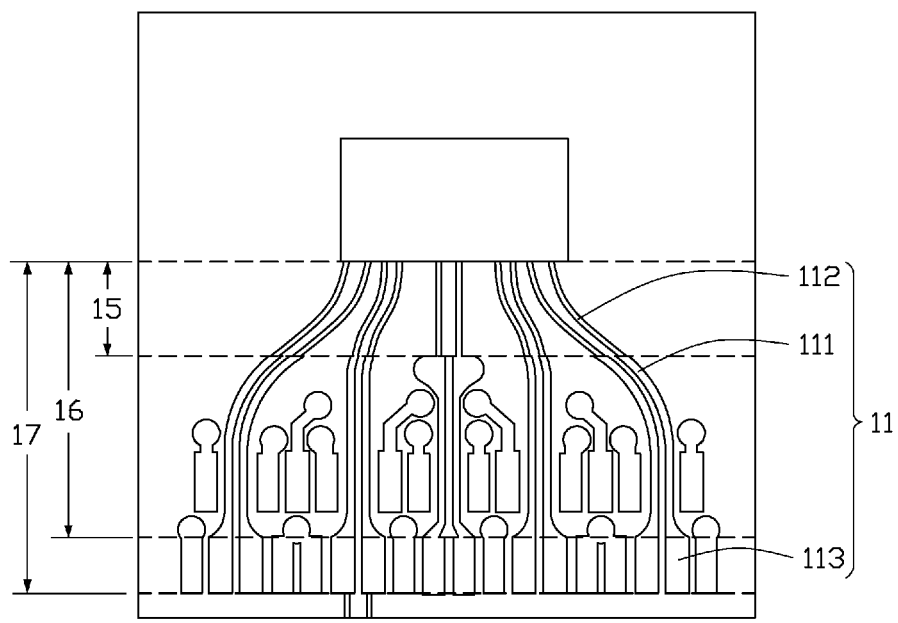
FIG. 2 is a top plan view of the signal routing layer of the circuit board shown in FIG. 1.

FIGS. 1 to 2 show a circuit board 10 with signal routing layer having uniform impedance, of one embodiment. The circuit board 10 includes a signal routing layer 11, a first dielectric layer 12, a second dielectric layer 13, a third dielectric layer 14, a first ground layer 15, a second ground layer 16, and a third ground layer 17. In this embodiment, the signal routing layer 11 includes conductor wires arrayed on the circuit board 10. The first dielectric layer 12, the first ground layer 15, the second dielectric layer 13, the second ground layer 16, the third dielectric layer 14, and the third ground layer 17, in that order, are located at gradually increasing distances from the signal routing layer 11.

In practice, the circuit board 10 will also include conductor layers. In this embodiment, the conductor layers are not shown.

The signal routing layer 11 and the first ground layer 15 are located on two surfaces of the first dielectric layer 12. In other words, the first dielectric layer 12 is sandwiched between the signal routing layer 11 and the first ground layer 15.

The signal routing layer 11 connects to electronic components, such as ball grid arrays (BGAs), resistors, or capacitors, for example. The signal routing layer 11 includes a plurality of signal traces 111, a plurality of chip traces 112, and a plurality of connector traces 113. The signal traces 111 are connected to the chip traces 112 and to the connector traces 113. The chip traces 112 are received by chips, such as by CPUs. The connector traces 113 are connected to connectors, such as USB connectors.

Each of the signal traces 111, the chip traces 112, and the connector traces 113 is a single strip. The width of each of the signal traces 111 is different at different locations of the signal traces 111. The width of each of the signal traces 111 near the chip traces 112 is smaller than the width of each of the signal traces 111 near the connector traces 113, thus the impedance of each of the signal traces 111 near the chip traces 112 is greater than the impedance of each of the signal traces 111 near the connector traces 113.

The first dielectric layer 12 supports the signal routing layer 11. The first dielectric layer 12 is made of insulating material(s). In this embodiment, the first dielectric layer 12 is mainly made of fiberglass mixed with resin. In another embodiment, ceramic powder is also mixed into the fiberglass and resin.

The size of the first ground layer 15 is not larger than the size of the area of the first dielectric layer 12, the first ground layer 15 is arranged only under the chip traces 112.

The second dielectric layer 13 is sandwiched between the first ground layer 15 and the second ground layer 16. The material(s), shape(s), and size(s) of the second dielectric layer 13 are the same as those of the first dielectric layer 12. The second dielectric layer 13 can be in contact with the first dielectric layer 12 to increase the structural strength of the first dielectric layer 12, in supporting the signal routing layer 11.

The size of the second ground layer 16 is smaller than the total size of the signal traces 111 and the chip traces 112, but larger than the size of the chip traces 112 alone, thus the ground layer 16 is underneath the signal traces 111 and the chip traces 112, but is not underneath the connector traces 113.

The third dielectric layer 14 is sandwiched between the second ground layer 16 and the third ground layer 17. The third dielectric layer 14 is spaced from the second dielectric layer 13. The material(s), shape(s), and size(s) of the third dielectric layer 14 are the same as those of the second dielectric layer 12. The third ground layer 17 is under the signal traces 111, the chip traces 112, and the connector traces 113.

Because the distance between the chip traces 112 and the first ground layer 15 is smaller than that between the connector traces 113 and the third ground layer 16, the impedance of each of the chip traces 112 is reduced and the impedance of each of the connector traces 113 is increased, so that the impedance of the signal routing layer 11 is more uniform for a better signal transmitting ability.

Figure 3:
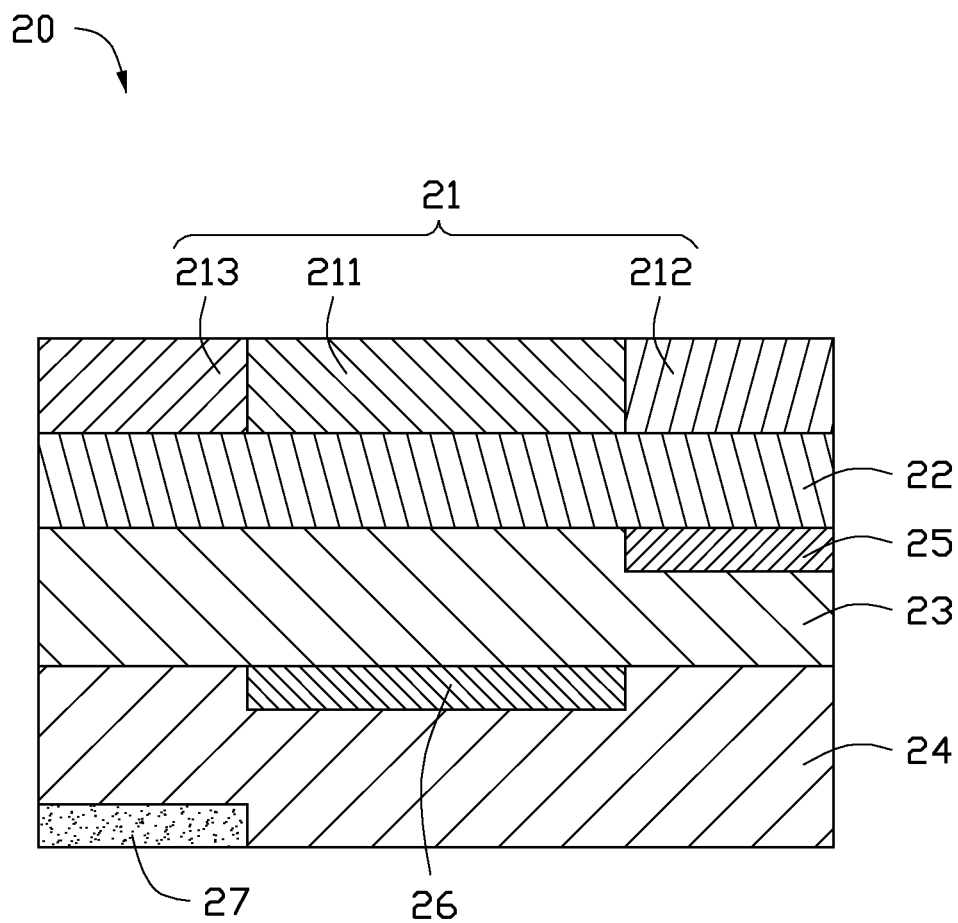
FIG. 3 is a sectional view of a circuit board with signal routing layer having uniform impedance, of another embodiment.

FIG. 3 shows a circuit board with signal routing layer having uniform impedance 20 of another embodiment.

The circuit board 20 comprises a signal routing layer 21, a first dielectric layer 22, a second dielectric layer 23, a third dielectric layer 24, a first ground layer 25, a second ground layer 26, and a third ground layer 27. The signal routing layer 21 includes signal traces 211, chip traces 212, and connector traces 213.

The first ground layer 25 is only underneath the chip traces 212, the second ground layer 26 is only underneath the signal traces 211, and the third ground layer 27 is only underneath the connector traces 213. The second dielectric layer 23 fills in the empty spaces between the first ground layer 25 and the second ground layer 26, and the third dielectric layer 24 fills the empty spaces between the second ground layer 26 and the third ground layer 27, so no internal empty spaces exist in the circuit board 20.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A circuit board, comprising:
a signal routing layer, comprising a plurality of connector traces, a plurality of chip traces, and a plurality of signal traces connected with the connector traces and the chip traces;
a first dielectric layer supporting the signal routing layer;
a second dielectric layer separated from the signal routing layer by the first dielectric layer;
a first ground layer sandwiched between the first dielectric layer and the second dielectric layer, the first ground layer having an area no larger than an area of the chip traces, the first ground layer positioned within a projection of the area of the chip traces on the second dielectric layer;
a third dielectric layer separated from the signal routing layer by the first dielectric layer and the second dielectric layer;
a second ground layer sandwiched between the second dielectric layer and the third dielectric layer, the second ground layer having an area no larger than a total area of the signal traces and the chip traces, the second ground layer positioned within a projection of the areas of the signal traces and the chip traces on the third dielectric layer; and
a third ground layer located on a surface of the third dielectric layer far away from the second dielectric layer.

2. The circuit board of claim 1, wherein a width of each of the signal traces near the chip traces is smaller than a width of each of the signal traces near the connector traces.

3. The circuit board of claim 1, wherein each of the first dielectric layer, the second dielectric layer, and the third dielectric layer is mainly made up of fiberglass mixed with resin.

4. The circuit board of claim 3, wherein each of the first dielectric layer, the second dielectric layer, and the third dielectric layer comprises ceramic powder.

5. The circuit board of claim 1, wherein each of the signal traces is a single strip.

6. The circuit board of claim 5, wherein each of the chip traces is a single strip.

7. The circuit board of claim 6, wherein each of the connector traces is a single strip.

8. The circuit board of claim 7, wherein each of the signal traces is directly connected to a respective one of the chip traces and a respective one of the connector traces.

9. The circuit board of claim 1, wherein the second ground layer has the area no larger than an area of the signal traces, and the second ground layer is positioned within a projection of the area of the signal traces on the third dielectric layer.

10. The circuit board of claim 1, wherein the third ground layer has an area no larger than an area of the connector traces, and the third ground layer is positioned within a projection of the area of the connector trace on the surface of the third dielectric layer far away from the second dielectric layer.

* * * * *